(12) United States Patent
Bonilla et al.

(10) Patent No.: US 7,737,528 B2
(45) Date of Patent: Jun. 15, 2010

(54) STRUCTURE AND METHOD OF FORMING ELECTRICALLY BLOWN METAL FUSES FOR INTEGRATED CIRCUITS

(75) Inventors: Griselda Bonilla, Fishkill, NY (US); Kaushik Chanda, Fishkill, NY (US); Ronald G. Filippi, Wappingers Falls, NY (US); Jeffrey P. Gambino, Westford, VT (US); Stephan Grunow, Poughkeepsie, NY (US); Chao-Kun Hu, Somers, NY (US); Sujatha Sankaran, New Paltz, NY (US); Andrew H. Simon, Fishkill, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 12/132,337

(22) Filed: Jun. 3, 2008

(65) Prior Publication Data

US 2009/0294901 A1 Dec. 3, 2009

(51) Int. Cl.
H01L 21/768 (2006.01)
(52) U.S. Cl. .............. 257/529; 257/665; 257/E23.141; 438/132; 438/601
(58) Field of Classification Search ............ 257/529, 257/665; 438/132, 601
See application file for complete search history.

(56) References Cited

U.S. PATENT DOCUMENTS

| | | | |
|---|---|---|---|
| 5,695,810 A | 12/1997 | Dubin et al. | |
| 5,882,998 A | 3/1999 | Sur, Jr. et al. | |
| 6,057,221 A * | 5/2000 | Bernstein et al. | 438/601 |
| 6,259,160 B1 | 7/2001 | Lopatin et al. | |
| 6,375,159 B2 | 4/2002 | Daubenspeck et al. | |
| 6,603,321 B2 | 8/2003 | Filippi, Jr. et al. | |
| 6,730,982 B2 | 5/2004 | Barth et al. | |
| 6,737,345 B1 | 5/2004 | Lin et al. | |
| 7,005,727 B2 | 2/2006 | Azimi et al. | |
| 7,157,798 B1 * | 1/2007 | Fair et al. | 257/768 |
| 2007/0210414 A1 | 9/2007 | Iwamoto et al. | |
| 2007/0262414 A1 | 11/2007 | Ueda | |
| 2008/0099889 A1 | 5/2008 | Kawahara | |
| 2009/0098689 A1 * | 4/2009 | Yang et al. | 438/132 |
| 2009/0134521 A1 * | 5/2009 | Liu et al. | 257/762 |
| 2009/0186481 A1 * | 7/2009 | Suzuki et al. | 438/686 |

OTHER PUBLICATIONS

PCT/ISA/220 Notification of Transmittal of the International Search Report and the Written Opinion of the International Searching Authority, or the Declaration, International Appl. No. PCT/US 09/44952 filed May 22, 2009.

* cited by examiner

*Primary Examiner*—A. Sefer
(74) *Attorney, Agent, or Firm*—Cantor Colburn LLP; Katherine Brown

(57) ABSTRACT

A fuse structure for an integrated circuit device includes an elongated metal interconnect layer defined within an insulating layer; a metal cap layer formed on only a portion of a top surface of the metal interconnect layer; and a dielectric cap layer formed on both the metal cap layer and the remaining portions of the metal interconnect layer not having the metal cap layer formed thereon; wherein the remaining portions of the metal interconnect layer not having the metal cap layer formed thereon are susceptible to an electromigration failure mechanism so as to facilitate programming of the fuse structure by application of electric current through the elongated metal interconnect layer.

20 Claims, 4 Drawing Sheets

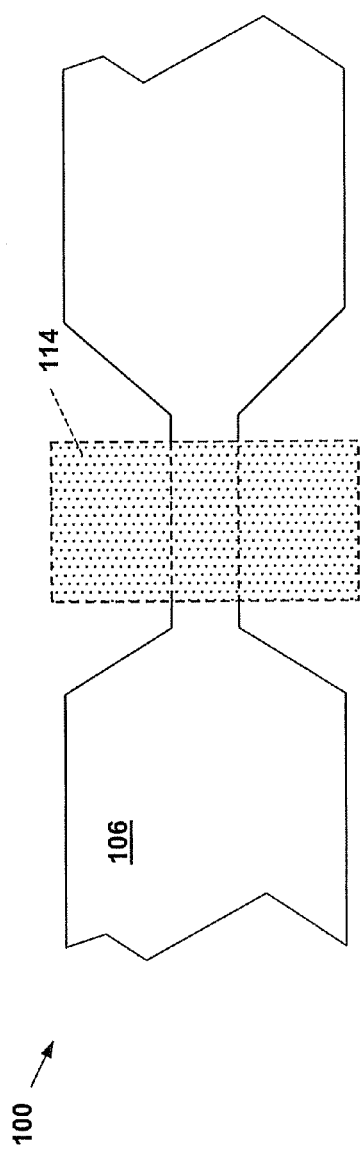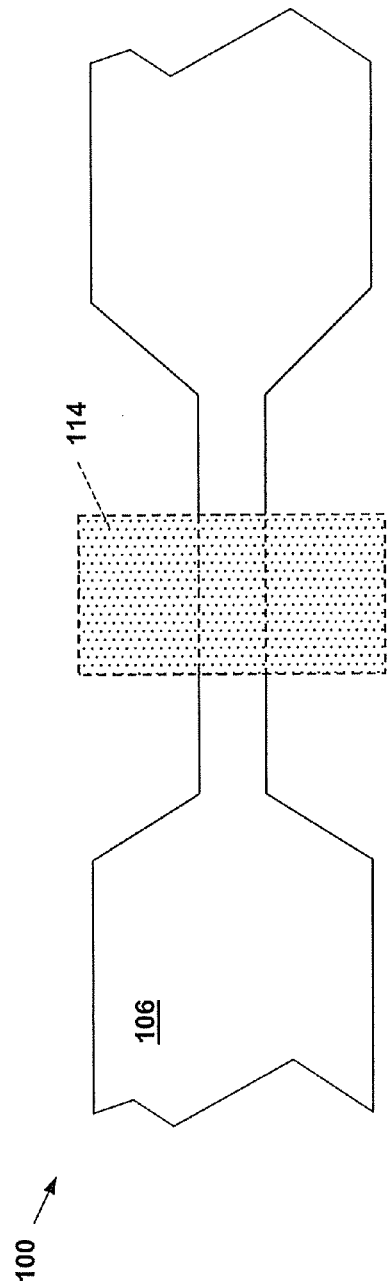

STRUCTURE AND METHOD OF FORMING ELECTRICALLY BLOWN METAL FUSES FOR INTEGRATED CIRCUITS

BACKGROUND

The present invention relates generally to integrated circuit (IC) device fabrication and, more particularly, to a structure and method of forming electrically blown metal fuses for integrated circuits.

In integrated circuit devices such as complementary metal oxide semiconductor (CMOS) integrated circuits, it is often desirable to be able to permanently store information, or to form permanent connections of the integrated circuit after it is manufactured. Fuses or devices forming fusible links are frequently used for this purpose. Fuses can also be used to program redundant elements to replace identical defective elements, for example. Further, fuses can be used to store die identification or other such information, or to adjust the speed of a circuit by adjusting the resistance of the current path.

One type of fuse device is "programmed" or "blown" using a laser to open a link by exposure to high-energy light after a semiconductor device is processed and passivated, thereby (for example) activating a redundant circuit. This particular type of fuse device requires precise alignment of the laser on the fuse device to avoid destroying neighboring devices. This and other similar approaches can result in damage to the device passivation layer, and thus, lead to reliability concerns. For example, the process of blowing the fuse can cause a hole in the passivation layer when the fuse material is displaced.

Another type of fuse device is based on the rupture, agglomeration or electromigration of silicided polysilicon. These types of fuses include a silicide layer disposed on a polysilicon layer, and overlain by an insulating layer such as silicon nitride. The silicide layer has a first resistance and the polysilicon layer has a second resistance greater than the first resistance. In an intact condition, the fuse link has a resistance determined by the resistance of the silicide layer. In common applications, when a programming potential is applied, providing a requisite current and voltage across the fuse element over time, the silicide layer begins to randomly ball-up, eventually causing an electrical discontinuity or rupture in some part of the silicide layer. Thus, the fuse link has a resultant resistance determined by that of the polysilicon layer (i.e., the programmed fuse resistance is increased with respect to that of the first resistance). However, this type of fuse device can result in damage to surrounding structure and/or suffers from unreliable sensing because of the inconsistent nature of the rupture process and the relatively small change typically offered in the programmed resistance. Further, these types of devices may not be viable for use with many of the latest process technologies because of the required programming potentials (i.e., current flow and voltage levels over a requisite amount of time).

In still another type of fuse, namely an electromigration fuse, a potential is applied across the conductive fuse link via the cathode and anode in which the potential is of a magnitude and direction to initiate electromigration of silicide from a region of the semiconductor fuse reducing the conductivity of the fuse link. Electromigration is a term referring to the phenomenon of mass transport of metallic atoms (e.g., copper or aluminum) which make up the interconnect material, as a result of unidirectional or DC electrical current conduction therethrough. More specifically, the electron current collides with the metal ions, thereby pushing them in the direction of current travel. The electromigration is enhanced by commencing a temperature gradient between the fuse link and the cathode responsive to the applied potential. Even with an electromigration fuse, the programming of the fuse is still dominated by the polysilicon material. Since the polysilicon film contains a significant number of imperfections, the final resistance has a wide distribution. This sometime results in a programmed fuse from being sensed incorrectly, thus leading to the failure of the chip.

In summary, integrated circuit fuses are conventionally either laser blown by exposure to high-energy light or electrically blown with a high current introduced through the structure. Typically, when the fuse material is a metal, a laser is used to blow the fuse structure, and when the fuse material is polysilicon, a high current is used to electrically blow the fuse structure. Of the two programming mechanisms, an electrically blown fuse is generally preferred since the electrical signal can be applied to the wafer using the same wafer probers that are used to test individual chips. In other words, a laser blown fuse requires an additional tool set, as well as an increase in the time to test the wafers. On the other hand, a metal fuse structure is advantageous in that, among other aspects, they are flexible with respect to their location in the integrated circuit device. Another advantage of electrically blown fuses (with respect to laser blown fuses) is that the programming can be implemented in the field, in addition to during fabrication of the device.

Accordingly, it would be desirable to be able to provide a metal fuse structure that is electrically blown, and without the use of excessive voltages and currents for accomplishing the programming.

SUMMARY

The foregoing discussed drawbacks and deficiencies of the prior art are overcome or alleviated, in an exemplary embodiment, by a fuse structure for an integrated circuit device, including an elongated metal interconnect layer defined within an insulating layer; a metal cap layer formed on only a portion of a top surface of the metal interconnect layer; and a dielectric cap layer formed on both the metal cap layer and the remaining portions of the metal interconnect layer not having the metal cap layer formed thereon; wherein the remaining portions of the metal interconnect layer not having the metal cap layer formed thereon are susceptible to an electromigration failure mechanism so as to facilitate programming of the fuse structure by application of electric current through the elongated metal interconnect layer.

In another embodiment, an electrically blown, metal fuse structure for an integrated circuit device includes an elongated copper interconnect layer defined within an insulating layer and surrounded on side and bottom surfaces thereof by a liner layer; a metal cap layer formed on only a portion of a top surface of the copper interconnect layer; and a dielectric cap layer formed on both the metal cap layer and the remaining portions of the copper interconnect layer not having the metal cap layer formed thereon; wherein the remaining portions of the copper interconnect layer not having the metal cap layer formed thereon are susceptible to an electromigration failure mechanism so as to facilitate programming of the fuse structure by application of electric current through the elongated copper interconnect layer.

In another embodiment, a method of forming a fuse structure for an integrated circuit device includes defining an elongated metal interconnect layer within an insulating layer; forming a metal cap layer on only a portion of a top surface of the metal interconnect layer; and forming a dielectric cap layer on both the metal cap layer and the remaining portions of the metal interconnect layer not having the metal cap layer formed thereon; wherein the remaining portions of the metal interconnect layer not having the metal cap layer formed thereon are susceptible to an electromigration failure mechanism so as to facilitate programming of the fuse structure by application of electric current through the elongated metal interconnect layer.

In still another embodiment, a method of forming an electrically blown, metal fuse structure for an integrated circuit device includes defining an elongated copper interconnect layer within an insulating layer and surrounded on side and bottom surfaces thereof by a liner layer; forming a metal cap layer on only a portion of a top surface of the copper interconnect layer; and forming a dielectric cap layer on both the metal cap layer and the remaining portions of the copper interconnect layer not having the metal cap layer formed thereon; wherein the remaining portions of the copper interconnect layer not having the metal cap layer formed thereon are susceptible to an electromigration failure mechanism so as to facilitate programming of the fuse structure by application of electric current through the elongated copper interconnect layer.

BRIEF DESCRIPTION OF THE DRAWINGS

Referring to the exemplary drawings wherein like elements are numbered alike in the several Figures:

FIG. 3 is a top view of the electrically blown metal fuse structure of FIG. 2(a), following resist patterning; and FIG. 4 is a top view of an alternative embodiment of the electrically blown metal fuse structure of FIG. 2(a).

DETAILED DESCRIPTION

Disclosed herein is a metal fuse structure for integrated circuits that is designed to be blown electrically without creating extensive damage thereto. That is, only a certain region of the metal fuse is blown, while the remainder of the structure remains relatively intact. Briefly stated, the metal fuse structure is formed by intentionally eliminating a conventional material used in the metal interconnect formation process such that a specific region of the structure becomes more susceptible to failure by a high current stress. In this way, an improved metal fuse structure can be implemented for use in IC designs.

Electromigration (EM) in Dual Damascene interconnect structures has been a significant reliability concern for copper (Cu) metallization. Failures can either occur in the via or in the line when the electron current flows from the via into the line above. Voids that form in the via are referred to as early fails, while those voids that form in the line are referred to as late fails. Conversely, when the electron flow is from the via into the line below, failures only occur within the line itself. It is thus well known that the top interface of a Dual Damascene interconnect is the main diffusion path during the EM process.

Usually, a dielectric cap such as silicon nitride ($Si_3N_4$) or silicon carbide (SiC) is deposited on top of the interconnects in order to prevent Cu from diffusing into the surrounding interlayer dielectric material. It has recently been shown that a metal cap, such tantalum (Ta), tantalum nitride (TaN), cobalt tungsten phosphide (CoWP), and ruthenium (Ru) can be applied to the top interface for better EM reliability. In so doing, the lifetime improvement is quite significant, as the Cu interconnects with a metal cap can handle much higher current densities compared to interconnects with just a dielectric cap material. In fact, it has been shown that for a dielectric cap, voiding occurs very early in Cu interconnects; consequently, damage can be induced relatively quickly under high-stress conditions. It has therefore been recognized herein that if a metal cap layer is intentionally not formed at a certain region of an interconnect structure, then this region would become more susceptible to electromigration failure.

Figure 1:
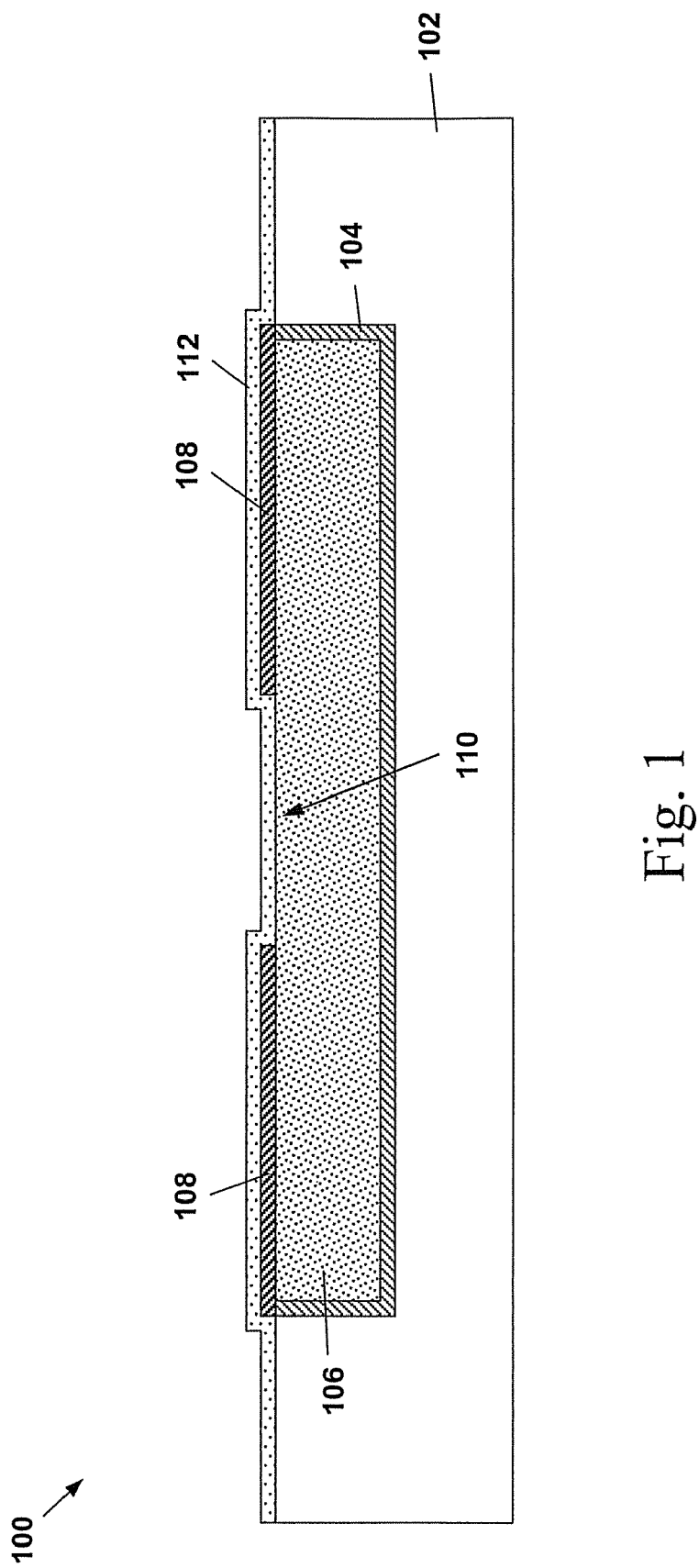
FIG. 1 is a cross-sectional view of an electrically blown metal fuse structure for integrated circuits, in accordance with an embodiment of the invention.

Referring now to FIG. 1, there is shown a cross-sectional view of an electrically blown metal fuse structure 100 for integrated circuits, in accordance with an embodiment of the invention. As is shown, an interlevel dielectric layer 102 (e.g., a low dielectric constant layer (also referred to as a "low-K" layer) such as SiCOH (carbon doped oxide) has a liner layer 104 (e.g., titanium (Ti), titanium nitride (TiN), tantalum (Ta), tantalum nitride (TaN), etc.) and an elongated copper layer 106 formed in a patterned trench defined therein, in accordance with known Dual Damascene processing techniques. The resulting metal line may correspond to, for example, the M1 level of the integrated circuit device. A metal cap 108, such as CoWP for example, is formed over opposing ends of the metal line such that there remains a region 110 at about a central portion of the top surface of the copper layer 106 where no metal cap material is present. A dielectric cap layer 112 (e.g., silicon carbon nitride (SiCN)) is formed over the entirety of the fuse device 100, including the region 110 where the metal cap 108 is absent.

By intentionally omitting the formation of the metal cap 108 at selective region 110 of the fuse structure 100, the structure thus becomes more susceptible to electromigration failure. In turn, by forcing a current through the structure 100, only the region 110 of the line without the metal cap 108 fails, while the rest of the line having the metal cap 108 should not be damaged. In order for the structure 100 to be used advantageously as a fuse device, a sufficiently high current is used such that failure occurs in a very short amount of time. In one exemplary embodiment, a method of implementing such a high-current stressing technique may be taken from U.S. Pat. No. 6,603,321 to Filippi, Jr., et al., assigned to the assignee of the present application, and the contents of which are incorporated by reference herein in their entirety.

More specifically, the high-current stressing technique is based on an isothermal stress where the current density through the metal line is increased until the temperature rise caused by Joule heating reaches approximately 400° C. (wherein the temperature is determined by measuring the resistance of the structure). The current density required to induce such a failure is on the order of about $10^7$ A/cm² or greater, and wherein the line should fail within about 1 minute for Cu lines with conventional dielectric cap materials. The failure time can be further reduced by increasing the current density and thus increasing the stress temperature. Since more power is generated in wide lines than for narrow lines, the required current density is higher for narrow lines than for wide lines. This means that, given the same stress condition, wide lines will fail earlier than narrow lines, which allows for many design variations of the structure.

Figure 2A:
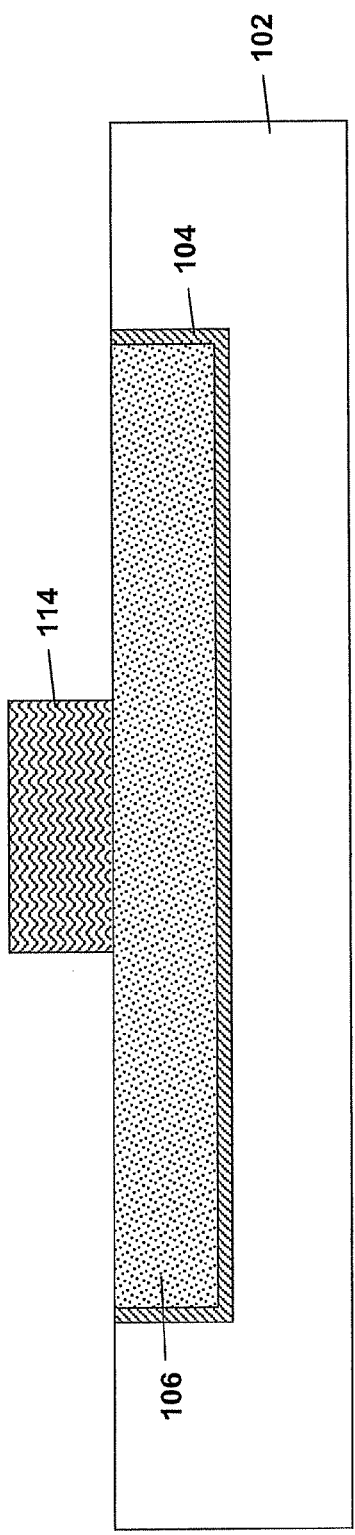
FIGS. 2(a) through 2(c) are cross-sectional views of an exemplary method of forming the structure of FIG. 1.
Figure 2B:
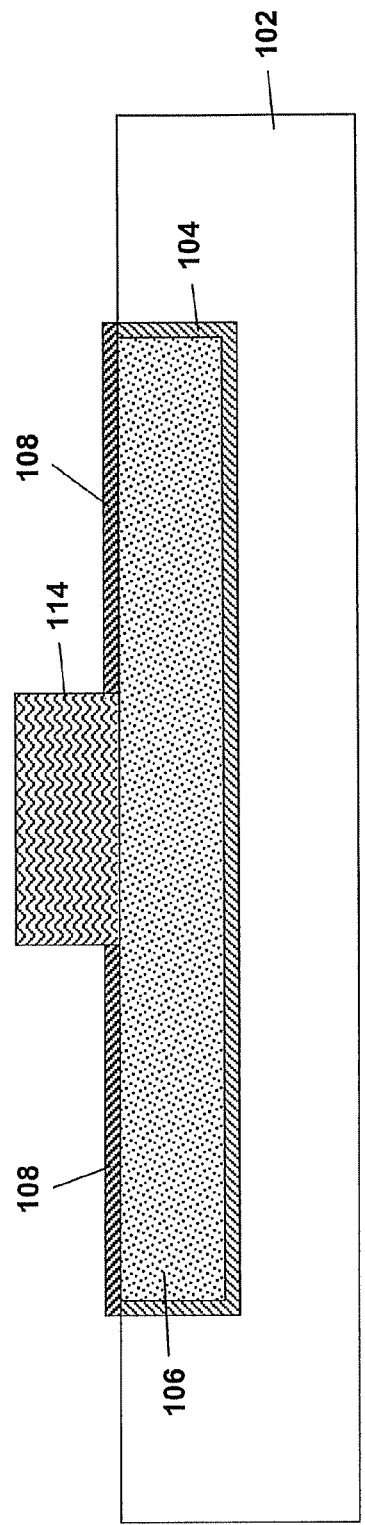
Figure 2C:
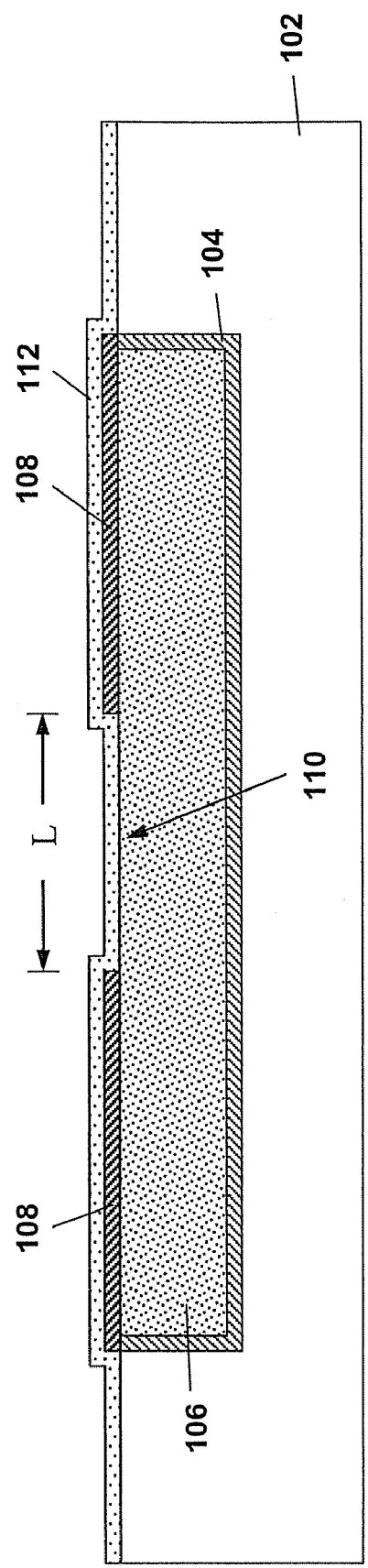

FIGS. 2(a) through 2(c) are cross-sectional views of an exemplary method of forming the structure of FIG. 1. In FIG. 2(a), a patterned block mask 114 (e.g., a photoresist material) is formed over a center portion of the Cu layer 106 so as to prevent that portion of the interconnect metal from having a metal cap deposited thereupon. As shown in FIG. 2(b), following patterning of the block mask 114, the CoWP cap 108 is locally deposited on the exposed areas of Cu layer 106 and liner layer 104, at opposing sides of the block mask 114. Once the block mask 114 is removed (e.g., through a resist strip solvent), the SiCN dielectric cap layer 112 is deposited over the entire structure, as shown in FIG. 2(c).

One specific dimensional parameter applicable to the proposed electrically blown metal fuse structure is that the length, L, of the region with missing CoWP (FIG. 2(c)) is greater than a "critical" length with respect to an electromigration short-length effect. As indicated above, electromigration is a reliability failure mechanism for metal interconnects in which metal atoms migrate under the influence of the electric field and electron flow in which, for the case of Cu interconnects, is in the direction of electron flow. During electromigration, the electron wind applies a force that results in an atomic flux, J, given by the following equation:

$$J = nv_e = n\left(\frac{D}{kT}\right)j\rho eZ^* \quad \text{(Eq. 1)}$$

where n is the density of atoms, $v_e$ is the drift velocity of migrating atoms, D is the effective diffusivity, k is Boltzmann's constant, T is the absolute temperature, j is the current density, $\rho$ is the resistivity and $eZ^*$ is the effective ion charge. The migration of atoms from a cathode end of a line leads to void formation in this region, which eventually causes a resistance increase in the line.

However, in the presence of a diffusion barrier, atoms accumulate at the anode end and deplete the cathode end of the conductor, leading to a stress gradient and back diffusion of atoms (see, for example, I. A. Blech, J. Appl. Phys. 47, 1203 (1976)). The combination of electromigration and the stress-induced back flow of atoms gives rise to a net atomic flux, $J_{eff}$, given by the following equation at steady state:

$$J_{eff} = n(v_e - v_b) = \frac{nD}{kT}\left(j\rho eZ^* - \frac{\Delta\sigma\Omega}{L}\right) \quad \text{(Eq. 2)}$$

where $v_b$ is the back flow velocity of atoms, $\Delta\sigma$ is the difference in stress between the cathode and the anode ends, $\Omega$ is the atomic volume and L is the conductor length. When the back stress gradient balances the electromigration force, mass transport is completely suppressed. This phenomenon is referred to as the electromigration threshold or the short-length effect, and occurs for sufficiently short interconnects and low current densities. The threshold condition is defined from the above relation for $J_{eff}$ such that:

$$(jL)_{th} = \frac{\Delta\sigma\Omega}{\rho eZ^*} \quad \text{(Eq. 3)}$$

where $(jL)_{th}$ is referred to as the threshold length product. For jL values less than $(jL)_{th}$, there is no electromigration failure in the interconnect structure. If j and L correspond exactly to the threshold condition, then the length of the interconnect corresponds to what is referred to as the critical length.

Ordinarily, for interconnect structures, short-length benefits are desirable, as they allow for electromigration improvement/elimination when achieved. However, in the present embodiments where electromigration is advantageously used in creating a metal fuse structure, the critical length is to be exceeded so that mass transport of atoms will not be suppressed by a balanced back stress gradient.

Returning to the above example, assuming a threshold length product, $(jL)_{th}$, of about 5000 A/cm, and a fuse programming current density of about $10^7$ A/cm$^2$, the critical length is about 5 microns (μm). However, in most cases the required length is actually less than this value, since somewhat higher current densities will be used to cause the EM failure and thus blow the fuse. For instance, it is conceivable that the critical length could be as low as 1 μm, depending upon the threshold length product, $(jL)_{th}$, and the fuse programming current density.

Finally, FIGS. 3 and 4 are top views of the metal fuse structure 100 following resist patterning as shown in FIG. 2(a). It will be noted that the specific layout of the fuse structure 100 is probably not critical for ensuring that the fuse structure will work properly. Rather, the exact design may be varied to achieve a desired failure time, such as, for example changing the width of the region where the metal cap is removed. In FIG. 3, the patterned block mask 114 for blocking CoWP formation covers most of the length of the narrow portion of the metal layer 106 in the depicted "dog bone" arrangement, whereas in FIG. 4, a relatively longer length is used for the narrow portion of the metal layer 106. Accordingly, by simply using a resist block mask prior to metal cap deposition, an effective, electrically blown metal fuse is created.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A fuse structure for an integrated circuit device, comprising:
    an elongated metal interconnect layer defined within an insulating layer, the elongated metal interconnect layer comprising wide regions at opposing ends thereof and a narrow region between the wide region;
    a metal cap layer formed on a top surface of the wide regions, and on only a portion of a top surface of the narrow region of the metal interconnect layer; and
    a dielectric cap layer formed on both the metal cap layer and the remaining portions of the narrow region of the metal interconnect layer not having the metal cap layer formed thereon;
    wherein the remaining portions of the narrow region of the metal interconnect layer not having the metal cap layer formed thereon is susceptible to an electromigration failure mechanism so as to facilitate programming of the fuse structure by application of electric current through the elongated metal interconnect layer.

2. The fuse structure of claim 1, wherein a length, L, corresponding to a distance between the metal cap layer at opposing ends of the metal interconnect layer corresponds to at least a critical length with respect to avoiding an electromigration short-length effect, for a given magnitude of fuse programming current density applied.

3. The fuse structure of claim 2, wherein the fuse programming current density is at least $10^7$ A/cm$^2$, and wherein L is about 1 micron (μm) or greater.

4. The fuse structure of claim 1, wherein the remaining portions of the metal interconnect layer not having the metal cap layer formed thereon corresponds to the location of a blocking mask formed prior to deposition of the metal cap layer.

5. The fuse structure of claim 1, wherein:
the metal cap layer comprises a material selected from the group of tantalum (Ta), tantalum nitride (TaN), cobalt tungsten phosphide (CoWP), and ruthenium (Ru); and
the dielectric cap layer comprises a material selected from the group of silicon nitride ($Si_3N_4$), silicon carbide (SiC), and silicon carbon nitride (SiCN).

6. An electrically blown, metal fuse structure for an integrated circuit device, comprising:
an elongated copper interconnect layer defined within an insulating layer and surrounded on side and bottom surfaces thereof by a liner layer, the elongated copper interconnect layer comprising wide regions at opposing ends thereof and a narrow region between the wide regions;
a metal cap layer formed on a top surface of the wide regions, and on only a portion of a top surface of the narrow region of the copper interconnect layer; and
a dielectric cap layer formed on both the metal cap layer and the remaining portions of the narrow region of the copper interconnect layer not having the metal cap layer formed thereon;
wherein the remaining portions of the narrow region of the copper interconnect layer not having the metal cap layer formed thereon is susceptible to an electromigration failure mechanism so as to facilitate programming of the fuse structure by application of electric current through the elongated copper interconnect layer.

7. The fuse structure of claim 6, wherein a length, L, corresponding to a distance between the metal cap layer at opposing ends of the copper interconnect layer corresponds to at least a critical length with respect to avoiding an electromigration short-length effect, for a given magnitude of fuse programming current density applied.

8. The fuse structure of claim 7, wherein the fuse programming current density is at least $10^7$ A/cm$^2$, and wherein L is about 1 micron (μm) or greater.

9. The fuse structure of claim 6, wherein the remaining portions of the copper interconnect layer not having the metal cap layer formed thereon corresponds to the location of a blocking mask formed prior to deposition of the metal cap layer.

10. The fuse structure of claim 6, wherein:
the metal cap layer comprises a material selected from the group of tantalum (Ta), tantalum nitride (TaN), cobalt tungsten phosphide (CoWP), and ruthenium (Ru); and
the dielectric cap layer comprises a material selected from the group of silicon nitride ($Si_3N_4$), silicon carbide (SiC), and silicon carbon nitride (SiCN).

11. A method of forming a fuse structure for an integrated circuit device, the method comprising:
defining an elongated metal interconnect layer within an insulating layer, the elongated metal interconnect layer comprising wide regions at opposing ends thereof and a narrow region between the wide regions;
forming a metal cap layer on a top surface of the wide regions, and on only a portion of a top surface of the narrow region of the metal interconnect layer; and
forming a dielectric cap layer on both the metal cap layer and the remaining portions of the narrow region of the metal interconnect layer not having the metal cap layer formed thereon;
wherein the remaining portions of the narrow region of the metal interconnect layer not having the metal cap layer formed thereon is susceptible to an electromigration failure mechanism so as to facilitate programming of the fuse structure by application of electric current through the elongated metal interconnect layer.

12. The method of claim 11, wherein a length, L, corresponding to a distance between the metal cap layer at opposing ends of the metal interconnect layer corresponds to at least a critical length with respect to avoiding an electromigration short-length effect, for a given magnitude of fuse programming current density applied.

13. The method of claim 12, wherein the fuse programming current density is at least $10^7$ A/cm$^2$, and wherein L is about 1 micron (μm) or greater.

14. The method of claim 11, wherein the remaining portions of the metal interconnect layer not having the metal cap layer formed thereon corresponds to the location of a blocking mask formed prior to deposition of the metal cap layer.

15. The method of claim 11, wherein:
the metal cap layer comprises a material selected from the group of tantalum (Ta), tantalum nitride (TaN), cobalt tungsten phosphide (CoWP), and ruthenium (Ru); and
the dielectric cap layer comprises a material selected from the group of silicon nitride ($Si_3N_4$), silicon carbide (SiC), and silicon carbon nitride (SiCN).

16. A method of forming an electrically blown, metal fuse structure for an integrated circuit device, the method comprising:
defining an elongated copper interconnect layer within an insulating layer and surrounded on side and bottom surfaces thereof by a liner layer, the elongated copper interconnect layer comprising wide regions at opposing ends thereof and a narrow region between the wide regions;
forming a metal cap layer on a top surface of the wide regions, and on only a portion of a top surface of the narrow region of the copper interconnect layer; and
forming a dielectric cap layer on both the metal cap layer and the remaining portions of the narrow region of the copper interconnect layer not having the metal cap layer formed thereon;
wherein the remaining portions of the narrow region of the copper interconnect layer not having the metal cap layer formed thereon is susceptible to an electromigration failure mechanism so as to facilitate programming of the fuse structure by application of electric current through the elongated copper interconnect layer.

17. The method of claim 16, wherein a length, L, corresponding to a distance between the metal cap layer at opposing ends of the copper interconnect layer corresponds to at least a critical length with respect to avoiding an electromigration short-length effect, for a given magnitude of fuse programming current density applied.

18. The method of claim 17, wherein the fuse programming current density is at least $10^7$ A/cm$^2$, and wherein L is about 1 micron (μm) or greater.

19. The method of claim 16, wherein the remaining portions of the copper interconnect layer not having the metal cap layer formed thereon corresponds to the location of a blocking mask formed prior to deposition of the metal cap layer.

20. The method of claim 16, wherein:
the metal cap layer comprises a material selected from the group of tantalum (Ta), tantalum nitride (TaN), cobalt tungsten phosphide (CoWP), and ruthenium (Ru); and
the dielectric cap layer comprises a material selected from the group of silicon nitride ($Si_3N_4$), silicon carbide (SiC), and silicon carbon nitride (SiCN).

* * * * *